United States Patent [19]
Cho et al.

[11] Patent Number: 5,398,270
[45] Date of Patent: Mar. 14, 1995

[54] DATA COINCIDENCE DETECTING CIRCUIT

[75] Inventors: Sung-il Cho, Incheon; Ki-ho Shin, Pucheon, both of Rep. of Korea

[73] Assignee: Samsung Electronics Co., Ltd., Suwon, Rep. of Korea

[21] Appl. No.: 29,597

[22] Filed: Mar. 11, 1993

[30] Foreign Application Priority Data

Mar. 11, 1992 [KR] Rep. of Korea ............... 92-3985

[51] Int. Cl.[6] .......................................... H03K 21/08
[52] U.S. Cl. ............................................ 377/39; 377/56; 377/114; 377/116; 327/23
[58] Field of Search ............... 377/392, 56, 114, 117, 377/116; 307/272.1, 272.2, 272.3, 573, 234; 340/146.2

[56] References Cited
U.S. PATENT DOCUMENTS 4,566,111 1/1986 Tanagawa .................... 377/39
4,843,254 6/1989 Motegi et al. ............... 307/272.2
5,170,074 12/1992 Aoki ............................ 307/272.2
5,289,516 2/1994 Kimura et al. ............... 377/39

*Primary Examiner*—John S. Heyman
*Assistant Examiner*—My Trang Nu Ton
*Attorney, Agent, or Firm*—Robert A. Westerlund, Jr.; Charles R. Donohoe; Stephen R. Whitt

[57] ABSTRACT

A data coincidence detecting circuit including a register for receiving n-bit data, a counter for counting up until $2^n$ to compare the n-bit data with it, a comparator for comparing the outputs of the register and the outputs of the counter, respectively to generate a coincidence detecting signal, a mask portion connected to the output of the comparator for masking the period from a time point when the n-bit data is input to a time point when the input of data ends, and a logic circuit for logically adding the output of the mask portion and the output of the comparator to output the result.

8 Claims, 5 Drawing Sheets 5,398,270

DATA COINCIDENCE DETECTING CIRCUIT

BACKGROUND OF THE INVENTION

1. Field of the Invention

The present invention relates to a data coincidence detecting circuit, and more particularly to a data coincidence detecting circuit composed of a MOS device.

2. Description of the Related Art

A data coincidence detecting circuit detects the coincidence of data provided by a clock with data written in a register. In a conventional data coincidence detecting circuit, when n-bits of data are written into a register regardless of the order of data, the coincidence detection may occur while the data is being written. In other words, the test for data coincidence can be performed before all of the bits of data are written into the register to be compared.

BACKGROUND OF THE INVENTION

FIG. 1 (Prior Art) is a schematic diagram illustrating a conventional data coincidence detection circuit. The conventional data coincidence detecting circuit comprises a register 10, a counter 20 and a comparator 30.

The register 10 has four latches 11, 12, 13 and 14. One latch corresponds to one bit of data (e.g. the LSB of data is loaded into latch 11 and the MSB of data is loaded into latch 14).

The comparator 30 has four one-bit "exclusive or" (XOR) logic gates 31, 32, 33 and 34. Each XOR logic gate corresponds to a particular latch (e.g. the MSB latch 11 corresponds to XOR gate 31 and the LSB latch 14 corresponds to the XOR gate 34).

The counter 20 has four T flip flops 21, 22, 23 and 24. Each flip flop corresponds to one latch and one XOR gate (e.g. the MSB T flip flop 21 corresponds to the LSB latch 11 and XOR gate 31 and the MSB T flip flop 24 corresponds to the LSB latch 14 and XOR gate 34).

The register 10 stores 4 bits of data. The counter 20 generates four bits of data to be compared to the data stored in the register 10. The four bits of data generated by the counter 20 is a four bit number. The number increases sequentially over time. The comparator compares the data supplied by the register 10 and the counter 20 and generates a coincidence signal when the data is the same.

The four latches 11, 12, 13 and 14 within the register 10 latch write signals D1, D2, D3 and D4 in response to respective enable signals EN1, EN2, EN3 and EN4.

The four T flip flops 21, 22, 23 and 24 within the counter 20 are reset in response to a reset signal R. A clock signal CK synchronizes the four T flip flops. The T flip flops 21, 22, 23 and 24 output signals Q1, Q2, Q3 and Q4 respectively.

The four XOR gates 31, 32, 33 and 34 within the comparator 30 compare the respective outputs of register 10 with the outputs Q1, Q2, Q3 and Q4 of counter 20. All of the outputs of each XOR gates are logically NORED in a NOR gate 35. A coincidence detection signal is generated by the NOR gate 35 when all of the outputs of the four XOR gates are logic level low "0".

FIG. 1B is a timing diagram illustrating the operation of the conventional data coincidence detecting circuit shown in FIG. 1A. The T flip flops 21, 22, 23 and 24 in the counter 20 are reset when a logic level low "0" reset signal R is applied to the T flip flops. Thereafter when the reset signal goes to logic level high "1", the flip flops count up from "0000" to "1111" in response to a clock signal CK. Data sets of 4 bits are loaded into the 4-bit register 10 sequentially having a time delay $\tau_4$ minus $\tau_3$ between the loading of separate bits. Enable signal EN1 enables latch 11, thereby latching the first bit of data. Enable signal EN2 subsequently enables the latching of the second bit of data, etc. For example, the loading of data "0010" into register 10 starts at time $\tau_1$, and continues until time $\tau_5$. The time which elapses between time $\tau_1$ and $\tau_5$ is referred to as the data load period. At time $\tau_2$, the output data of register 10 is "0010" and the output of counter 20 is "0010". Therefore, the output of comparator 30 goes to logic level high "1" indicating data coincidence. An error in the output data occurs between the times of $\tau_3$ and $\tau_4$ because of the changing state of data bits D2 and D3 when loaded.

SUMMARY OF THE INVENTION

It is an object of the present invention to provide a data coincidence circuit which masks the n-bit data writing periods from beginning to end, thereby performing coincidence detection after all of the desired data has been written into storage registers (i.e. all n-bits of the data have been written into the register to be compared).

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1A:
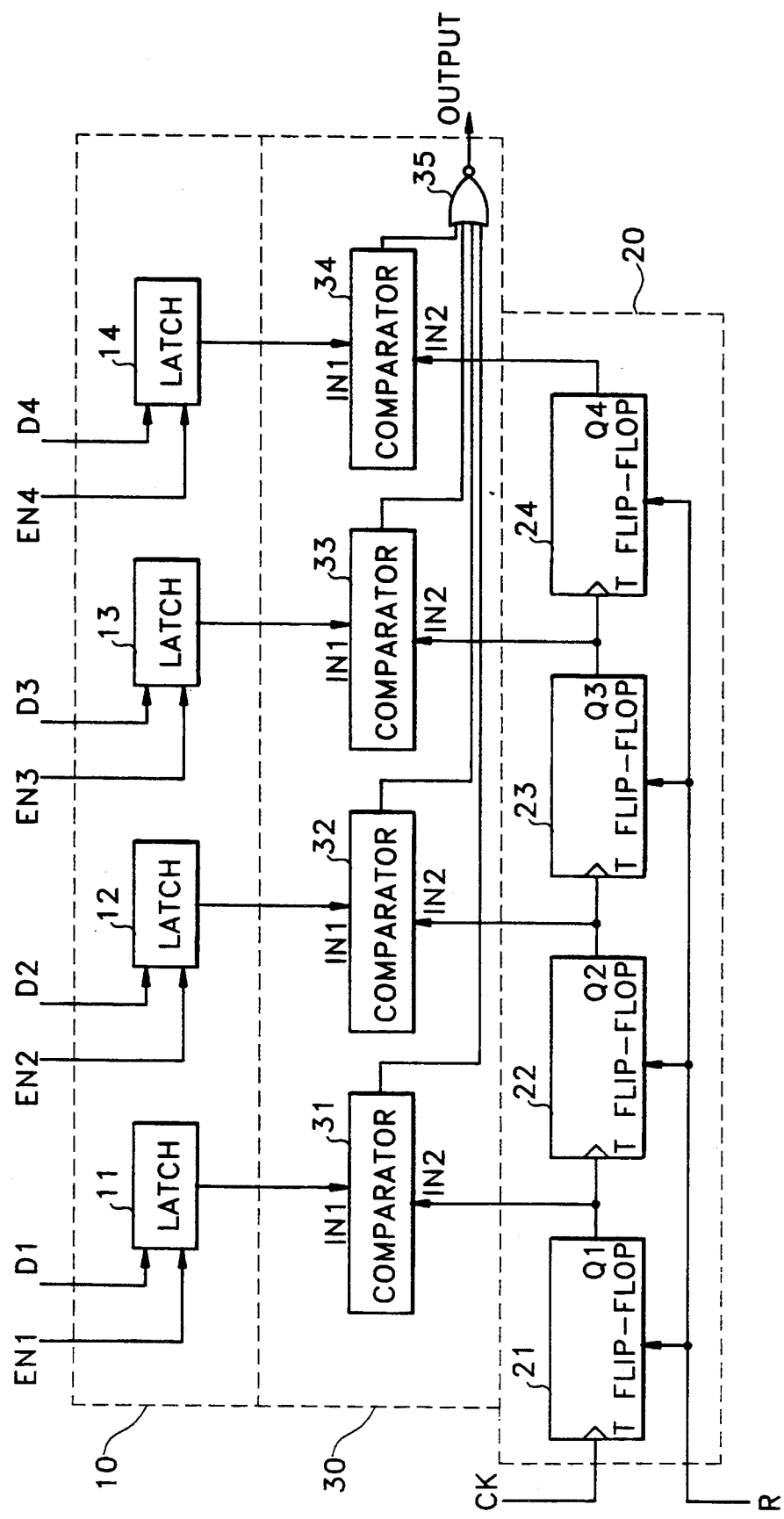
FIG. 1A is a block diagram illustrating a conventional data coincidence detection circuit.
Figure 1B:
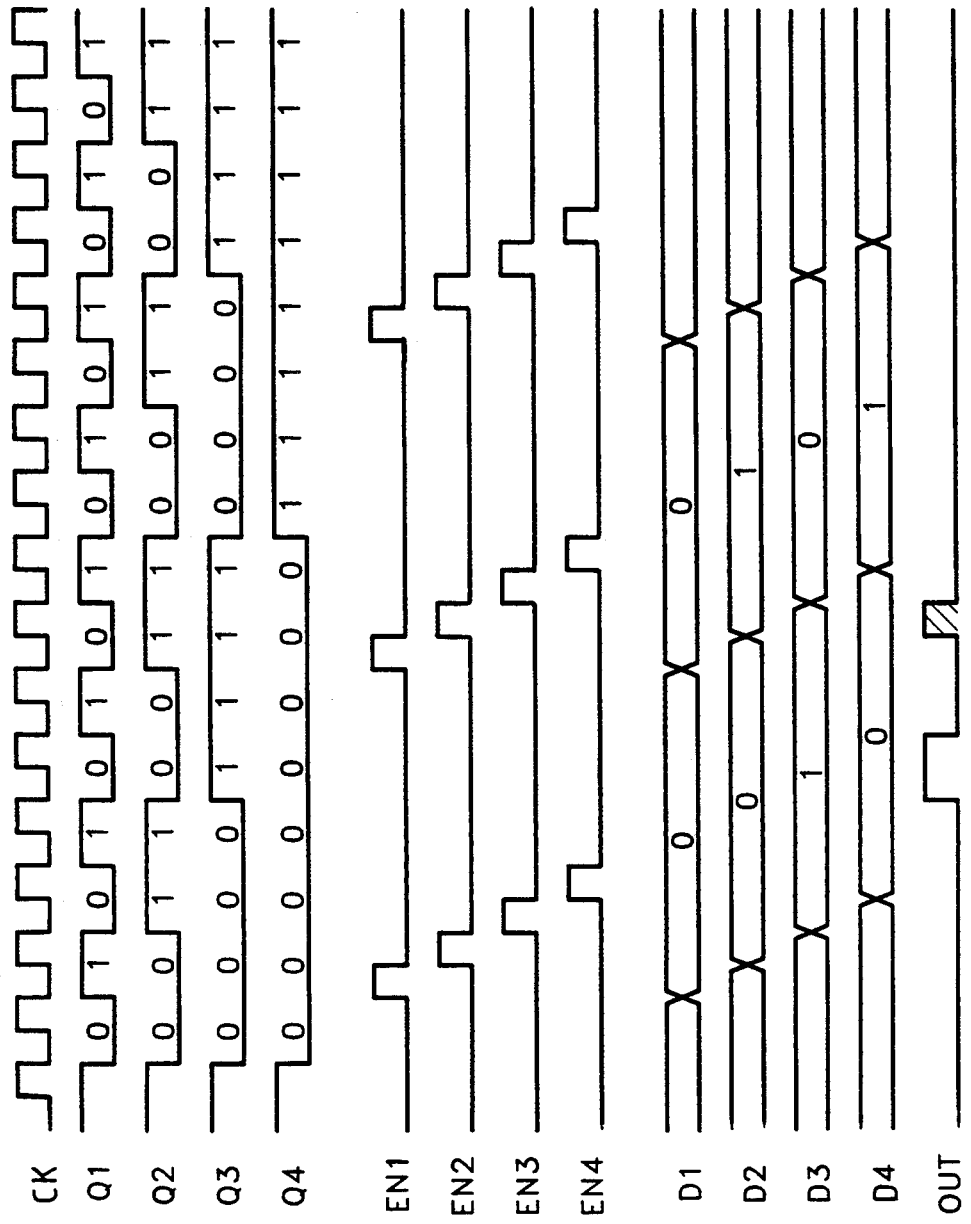
FIG. 1B is a timing diagram illustrating the operation of the conventional data coincidence detection circuit shown in FIG. 1A.
Figure 2:
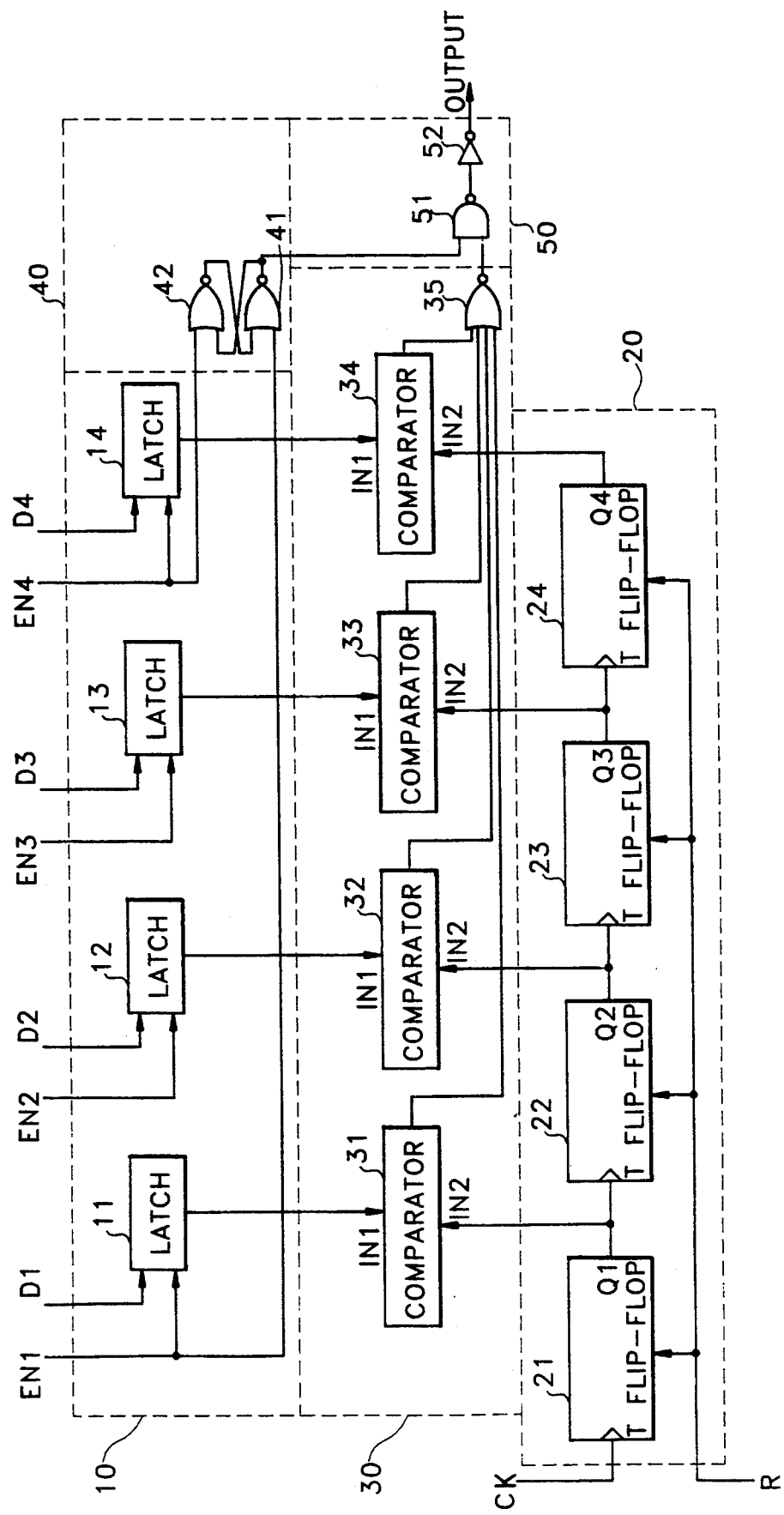
FIG. 2 is a block diagram illustrating a data coincidence detection circuit according to the present invention.

FIG. 2 is a schematic diagram showing the preferred embodiment of the data coincidence detecting circuit of the present invention. The data coincidence detecting circuit has a register 10, a counter 20, a comparator 30, a mask portion 40 and a logic circuit 50. The register 10, counter 20 and comparator 30 perform the same tasks and are organized in the same manner as described with reference to FIG. 1A. The mask portion 40 and the logic circuit 50 mask the data load period.

The mask portion 40 has two NOR gates 41 and 42. The output of each NOR gate is input to the other NOR gate (i.e. the output of NOR gate 41 is input to NOR gate 42 and the output of NOR gate 42 is input to NOR gate 41). NOR gate 42 receives enable signal EN4 as a second input. Enable signal EN1 is a second input into NOR gate 41. Finally, the output of NOR gate 41 is supplied to the logic circuit 50.

The logic circuit 50 has a NAND gate 51 receiving an input from the NOR gate 41 and the NOR gate 35 in the comparator 30. An inventer 52 receives the output of NAND gate 51 and generates the output signal OUTPUT of the data coincidence detecting circuit.

Figure 3B:
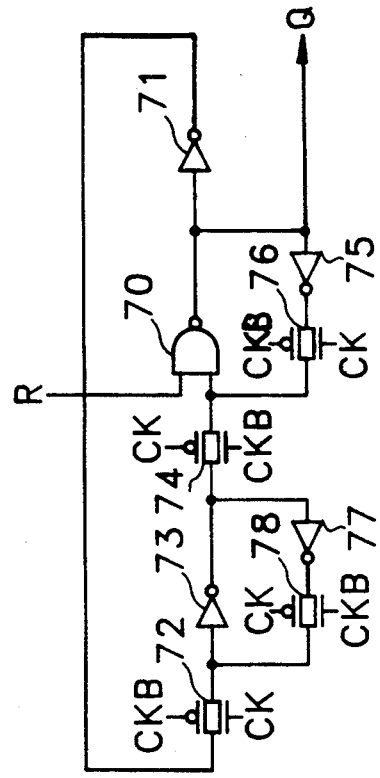
FIG. 3B is a schematic diagram illustrating T flip flops within the counter 20 according to one embodiment of the data coincidence circuit.
Figure 3A:
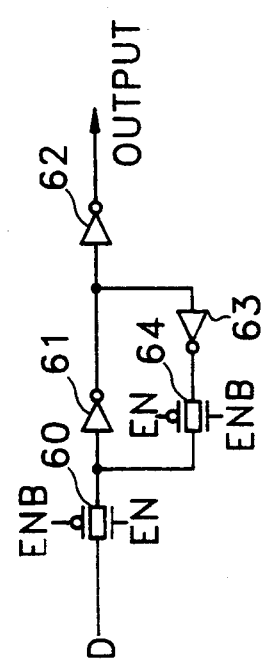
FIG. 3A is a schematic diagram illustrating latches within the register 10 according to one embodiment of the present invention.

FIG. 3A is a schematic diagram showing exemplary latch circuits used in the register 10. Input Di (i=1−4) flows through a CMOS transmission gate 60, and inverters 61 and 62 (respective to signal flow) to output OUTP. A feedback loop takes the signal output by the inverter 61 and feeds it back to the inverter's 61 input. The feedback loop has an inverter 63 and a CMOS transmission gate 64 (respective to signal flow). The CMOS transmission gate 60 transmits input signal Di (i=1−4) in response to an enable signal ENi (i=1−4). The two inverters 61 and 62 connected in series buffer the signal output by the transmission gate 60. The CMOS transmission gate 64 transmits the output of the inverter 63 to the inverter 61 in response to an inverted enable signal ENi (i=1−4). Enable signal ENBi (i=1−4) is the complement (not shown) of Enable signal ENi (i=1−4). The inverter 63 and CMOS transmission gate 64 latch the output from transmission gate 60.

FIG. 3B is a schematic diagram showing exemplary T flip flop circuits used in the counter 20. A NAND gate 70 receives the reset signal R and a feedback signal. The feedback signal is generated by an inverter 71, a CMOS transmission gate 72, an inverter 73 and a CMOS transmission gate 74 (respective to signal flow). A first small feedback loop takes the signal output by the inverter 73 and feeds it back to the inverter's 73 input. The first small feedback loop has an inverter 77 and a CMOS transmission gate 78 (respective to signal flow). A second small feedback loop takes the signal output by the NAND gate 70 and feeds it back to the NAND gate's 70 input. The second signal feedback loop has an inverter 75 and a CMOS transmission gate 76 (respective to signal flow). The T flip flop circuit uses the NAND gate 70 and inverter 71 to reset output Qi (i=1−4) by reset signal R. The CMOS transmission gate 72 and inverter 73 transmit the output of the inverter 71 in response to clock signal CK. The CMOS transmission gate 76 connected to one input of the NAND gate 70 simultaneously latches the output of the inverter 75 (which inverts the output of NAND gate 70). The CMOS transmission gate 78 connected to the input of the inverter 73 latches the output of the inverter 77 (which inverts the output of inverter 73) in response to inverted clock signal CKB. The inverted clock signal CKB is the complement (not shown) of the clock signal CK.

Figure 3C:
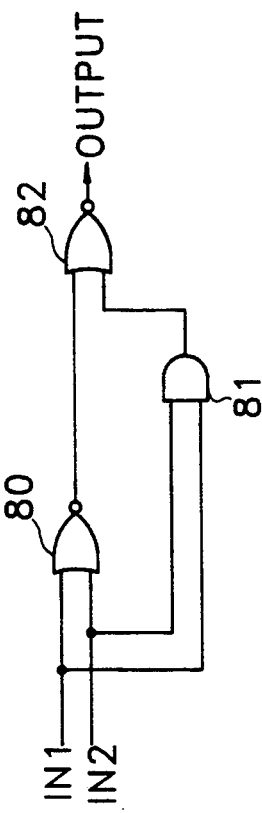
FIG. 3C is a schematic diagram illustrating XOR gates within the comparator 30 according to one embodiment of the data coincidence circuit.

FIG. 3C is a schematic diagram showing exemplary bit comparator circuits used in the comparator 30. The exemplary comparator used in this illustration is an XOR gate. The XOR gate has a NOR gate 80 for receiving first and second inputs IN1 and IN2, and a NOR gate 82 for receiving and outputting the outputs of NOR gate 80 and AND gate 81.

Figure 4:
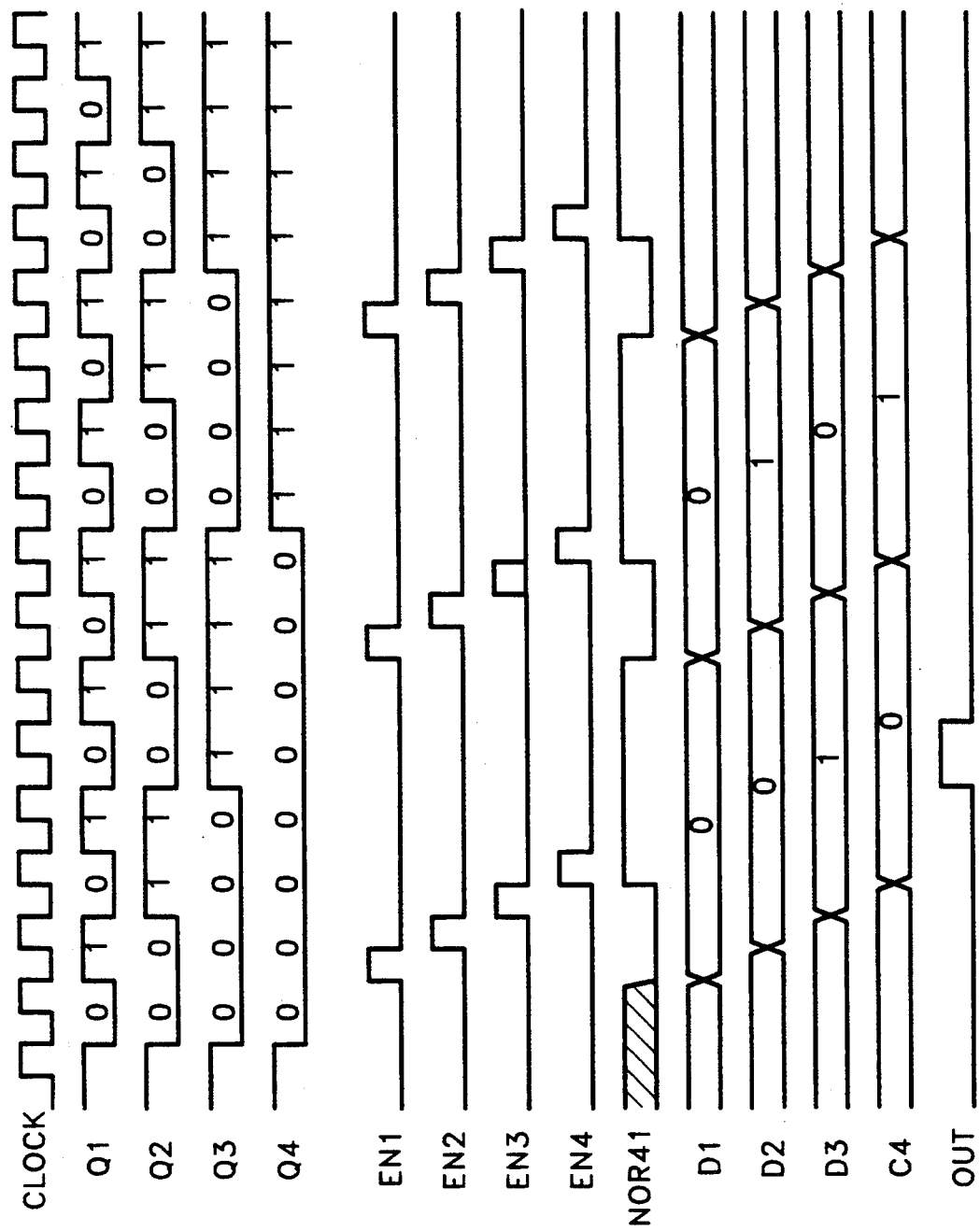
FIG. 4 is a timing diagram illustrating the operation of the data coincidence detection circuit shown in FIG. 2.

FIG. 4 is a timing diagram illustrating the operation of the data coincidence detecting circuit. When a logic low "0" reset signal R is applied to the flip flops 21, 22, 23 and 24, these flip flops are reset. Afterwards, when the reset signal R goes to logic level high "1", the flip flops count up from "0000" to "1111" in response to the clock signal CK.

If the LSB enable signal EN1 is logic level high "1" and the MSB enable signal EN4 is logic level low "0" the output of NOR gate 41 stays logic level low "0". Therefore, the output of the NAND gate 51 is logic level high "1". Inverter 52 complements the logic level high "1", so a logic level low "0" is output by the data coincidence detection circuit. If the MSB enable signal EN4 is logic level high "1" and the LSB enable signal EN1 is logic level low "0" the output of NOR gate 41 goes to logic level high "1". Therefore, the output of the NAND gate 51 is the logic level output by the nor gate 35. The signal output from the NAND gate 51 is inverted by the inverter 52. Therefore, when the outputs of all of the bit comparators 31, 32, 33 and 34 are logic level low "0", the output signal OUTPUT is logic level high "1", thereby identifying data coincidence.

Accordingly, with an additional circuit for receiving n-bit data in a register in a specified order and masking the data load, the data coincidence detecting circuit of the present invention is capable of generating an errorless and precise data coincidence signal.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A data coincidence detecting circuit comprising:
  a register having an input and a parallel output for latching input n-bit data and outputting said input n-bit data as output n-bit data;
  a counter for sequentially counting n-bit numbers up to $2^n$ and outputting said sequentially counted n-bit numbers as counter data;
  a comparator having an output for comparing said latched output n-bit data with a counter data to generate an output coincidence detecting signal, wherein said comparator comprises:
    i) a plurality n of XOR gates, each having an output, for comparing respective signals; and
    ii) a logic circuit for activating said data coincidence detecting signal when all of said outputs of said XOR gates are low; and
  a mask circuit connected to said comparator output for masking said data coincidence detecting signal during a time period when said latched n-bit data is being serially input to said register, said mask circuit comprising a detecting circuit for detecting said time period and for generating a data load detection signal.

2. A data coincidence detecting circuit as in claim 1, wherein said mask circuit further comprises:
  a logic circuit for gating said latch coincidence detecting signal with said data load detection signal.

3. A data coincidence detecting circuit as in claim 1, wherein said register is composed of n latches for sequentially storing n-bit data.

4. A data coincidence detecting circuit as in claim 3, wherein each of said latches comprises:
  a first transmission gate, having a signal input, a signal output, and an enable input, for transmitting one bit of said n-bit data in response to an enable signal;
  first and second inverters, each having an input and an output, connected in series for buffering and outputting said one bit of said n-bit data of said first transmission gate;

a third inverter having an input connected to said output of said first inverter for latching said one bit of said n-bit data of said first transmission gate; and a second transmission gate for transmitting an output of said third inverter to said input of said first inverter in response to an inverted enable signal applied to a second transmission gate enable input.

5. A data coincidence detecting circuit as in claim 1, wherein said mask circuit masks period from a time point when n-bit data starts to be input into said register to a time point when said input of data into said register ends.

6. A data coincidence detecting circuit as in claim 1, wherein said mask portion comprises:

a first NOR gate for receiving a first data enable signal via a first input; and a second NOR gate for receiving an output of said first NOR gate and an nth data enable signal and providing an output of said second NOR gate to a second input of said first NOR gate.

7. A data coincidence detecting circuit comprising:

a register having an input and a parallel output for latching n-bit data and outputting said input n-bit data as output n-bit data;

a counter having an output for sequentially counting n-bit numbers up to $2^n$ and outputting said sequentially counted n-bit numbers as counter data, said counter including n cascaded T flip flops which are synchronized by a first clock signal, wherein each of said T flip flops comprises:

i.) a first NAND gate and a first inverter generating a reset signal for resetting an output of said T flip flop;

ii.) a first transmission gate and a second inverter for transmitting an output of said first inverter in response to a said first clock signal;

iii.) a second transmission gate for latching an output of a third inverter which inverts an output of said first NAND gate and transmitting a result to an input of said first NAND gate; and iv.) a third transmission gate for latching an output of a fourth inverter which inverts an output of said second inverter in response to a second clock signal, said second clock signal being an inversion of said first clock signal, and transmitting a result to an input of said second inverter;

a comparator having an output for comparing said latched output n-bit data with some of said counter data to generate an output coincidence detecting signal;

a mask circuit connected to said comparator output for masking a data coincidence detecting signal during a time period when said latched n-bit data is being serially input to said register, said mask circuit comprising a detecting circuit for detecting said time period and for generating a data load detection signal.

8. A data coincidence detecting circuit comprising:

storing means for storing a first n-bits of data and having a serial data load time period beginning at a start of loading and ending at a conclusion of loading said n-bits of data into said storing means;

a counter having an output for sequentially counting n-bit numbers up to $2^n$ and outputting said sequentially counted n-bit numbers as counter data, said counting means including n cascaded T flip flops which are synchronized by a first clock signal, wherein each of said T flip flops comprises:

i.) a first NAND gate and a first inverter generating a reset signal for resetting an output of said T flip flop;

ii.) a first transmission gate and a second inverter for transmitting an output of said first inverter in response to a said first clock signal;

iii.) a second transmission gate for latching an output of a third inverter which inverts an output of said first NAND gate and transmitting a result to an input of said first NAND gate; and iv.) a third transmission gate for latching an output of a fourth inverter which inverts an output of said second inverter in response to a second clock signal, said second clock signal being an inversion of said first clock signal, and transmitting a result to an input of said second inverter;

comparing means for comparing said n-bits of data to said n-bit numbers and generating a coincidence signal when said n-bits of data is equal to said n-bit number; and suppression means for suppressing an external output of said coincidence signals generated during said serially loaded data load time period.

* * * * *